United States Patent
Masic

(10) Patent No.: US 9,591,734 B1
(45) Date of Patent: Mar. 7, 2017

(54) REDUCTION OF PERIODIC OSCILLATIONS IN A SOURCE PLASMA CHAMBER

(71) Applicant: ASML Netherlands B.V., Veldhoven (NL)

(72) Inventor: Milenko Masic, Carlsbad, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 14/869,856

(22) Filed: Sep. 29, 2015

(51) Int. Cl.
 *H05G 2/00* (2006.01)
 *G03F 7/20* (2006.01)

(52) U.S. Cl.
 CPC ......... *H05G 2/008* (2013.01); *G03F 7/70033* (2013.01)

(58) Field of Classification Search
 None
 See application file for complete search history.

(56) References Cited

U.S. PATENT DOCUMENTS

| | | | | |
|---|---|---|---|---|
| 7,372,056 B2* | 5/2008 | Bykanov | ................ | H05G 2/001 250/495.1 |
| 8,569,722 B2* | 10/2013 | Kakizaki | ................ | H05G 2/003 250/504 R |
| 8,598,552 B1* | 12/2013 | Frihauf | ................ | H05G 2/005 250/504 R |
| 8,872,123 B2* | 10/2014 | Crouch | ................ | H05G 2/003 250/372 |
| 9,238,243 B2* | 1/2016 | van der Burgt | ....... | H05G 2/008 |
| 9,363,877 B2* | 6/2016 | Graham | ................ | H05G 2/008 |

* cited by examiner

*Primary Examiner* — Jack Berman
(74) *Attorney, Agent, or Firm* — Gard & Kaslow LLP

(57) ABSTRACT

In laser-produced plasma (LPP) extreme ultraviolet (EUV) systems, pressure waves and other impulsive disturbances originating from plasma bubble emitting EUV light are created which affect flight of incoming droplets. These disturbances slow the migration of subsequent droplets to the plasma bubble. Because the incoming droplets are slowed, the laser beam does not directly hit the droplet at a primary focus point. This causes the resulting level of EUV light generated to be lower than expected and is manifested as a periodic oscillation in the LPP EUV system. An iterative learning controller (ILC) is used to reduce the periodic oscillations when operating the LPP EUV system in a burst mode or a continuous mode. The ILC, on the rising edge of each burst, uses an error signal collected during a completed burst and the input control signal from the completed burst to update the input control signal for a next burst.

20 Claims, 9 Drawing Sheets

REDUCTION OF PERIODIC OSCILLATIONS IN A SOURCE PLASMA CHAMBER

BACKGROUND

Field

The present application relates generally to laser systems and, more specifically, to reducing periodic oscillations in extreme ultraviolet light energy generated within a source plasma chamber.

Related Art

The semiconductor industry continues to develop lithographic technologies which are able to print ever-smaller integrated circuit dimensions. Extreme ultraviolet ("EUV") light (also sometimes referred to as soft x-rays) is generally defined to be electromagnetic radiation having wavelengths of approximately between 10 and 100 nm. EUV lithography is generally considered to include EUV light at wavelengths in the range of 10-14 nm, and is used to produce extremely small features (e.g., sub-32 nm features) in substrates such as silicon wafers. These systems must be highly reliable and provide cost-effective throughput and reasonable process latitude.

Methods to generate EUV light include, but are not necessarily limited to, converting a material into a plasma state that has one or more elements (e.g., xenon, lithium, tin, indium, antimony, tellurium, aluminum, etc.) with one or more emission line(s) in the EUV range. In one such method, often termed laser-produced plasma ("LPP"), the required plasma can be generated by irradiating a target material, such as a droplet, stream or cluster of material having the desired line-emitting element, with a laser beam at an irradiation site within an LPP EUV source plasma chamber.

FIG. 1 illustrates some of the components of a prior art LPP EUV system 100. A laser source 101, such as a $CO_2$ laser, produces a laser beam 102 that passes through a beam delivery system 103 and through focusing optics 104 (comprising a lens and a steering mirror). Focusing optics 104 have a primary focus point 105 at an irradiation site within an LPP EUV source plasma chamber 110. A droplet generator 106 produces droplets 107 of an appropriate target material that, when hit by laser beam 102 at the primary focus point 105, generate a plasma which irradiates EUV light. An elliptical mirror ("collector") 108 focuses the EUV light from the plasma at a focal spot 109 (also known as an intermediate focus position) for delivering the generated EUV light to, e.g., a lithography scanner system (not shown). Focal spot 109 will typically be within a scanner (not shown) containing wafers that are to be exposed to the EUV light. In some embodiments, there may be multiple laser sources 101, with beams that all converge on focusing optics 104. One type of LPP EUV light source may use a $CO_2$ laser and a zinc selenide (ZnSe) lens with an anti-reflective coating and a clear aperture of about 6 to 8 inches.

The LPP EUV system 100 can be operated in a burst mode where a number of light pulses are generated in a burst with some amount of time between bursts. When operating an LPP EUV system 100 in the burst mode, the resulting EUV energy may be subject to instabilities or oscillations that may arise due to small changes in operating conditions. These oscillations are a result of one or more of the droplets 107 not arriving at the primary focus point 105 exactly when a pulse of the laser beam 102 is fired. By not being in position, the droplet is not fully irradiated by the laser beam 102, and the amount of EUV energy generated from the droplet is reduced.

SUMMARY

In one embodiment, a laser-produced plasma (LPP) extreme ultraviolet (EUV) generation system comprises: a laser source configured to fire laser pulses at a primary focus point within an LPP EUV source plasma chamber of the LPP EUV system during a first burst when the LPP EUV system is operating; a droplet generator configured to generate and convey droplets towards the primary focus point within the LPP EUV source plasma chamber; and a system controller comprising: a data module configured to obtain data about the first burst of the LPP EUV system, the data comprising a first control signal vector and a first error vector, wherein the first error vector is a difference between a first desired output vector and a first actual output vector due at least in part to a periodic disturbance or presence of periodic system orbits in the LPP EUV system, an iterative learning controller (ILC) configured to generate a second control signal vector based on the first control signal vector and the first error vector, and a communication module configured to communicate the second control signal vector to the laser source or the droplet generator for a second burst.

In another embodiment, a method comprises: firing laser pulses at a primary focus point within an LPP EUV source plasma chamber of an LPP EUV system during a first burst when a laser source is operating in a burst mode; generating and conveying droplets towards the primary focus point within the LPP EUV source plasma chamber using a droplet generator; obtaining data about the first burst of the LPP EUV system, the data comprising a first control signal vector and a first error vector, wherein the first error vector is a difference between a first desired output vector and a first actual output vector due at least in part to a periodic disturbance or presence of periodic system orbits in the LPP EUV system; generating, by a controller, a second control signal vector using an ILC, wherein the generating is based on the first control signal vector and the first error vector; and communicating the second control signal vector from the controller to the laser source or the droplet generator for a second burst.

In a further embodiment, a non-transitory computer-readable medium having instructions embodied thereon, the instructions executable by one or more processors to perform operations comprising: firing laser pulses at a primary focus point within an LPP EUV source plasma chamber of an LPP EUV system during a first burst when a laser source is operating; generating and conveying droplets towards the primary focus point using a droplet generator within the LPP EUV source plasma chamber; obtaining data about the first burst of the LPP EUV system, the data comprising a first control signal vector and a first error vector, wherein the first error vector is a difference between a first desired output vector and a first actual output vector at least in part to a periodic disturbance or presence of periodic system orbits in the LPP EUV system; generating, by a controller, a second control signal vector using an ILC, wherein the generating is based on the first control signal vector and the first error vector; and communicating the second control signal vector from the controller to source laser or the droplet generator for a second burst.

DETAILED DESCRIPTION

In LPP EUV systems, the amount of EUV energy generated is maximized when a droplet arrives at a primary focus point when a pulse of a laser beam is fired at the primary focus point. However, when conveyed from the droplet generator, the droplet is slowed by one or more pressure waves propagating from the surface of the plasma bubble to the droplet generator. The pressure waves are caused by previous droplets impacting a plasma bubble formed around the primary focus point. When the droplet is slowed, it does not reach the primary focus point in time to be completely irradiated by a pulse of the laser beam when it is fired, unless there is some compensation made for the delay. The laser beam, instead of hitting the droplet, may only hit a portion of the droplet or miss the droplet entirely. The distance between the droplet and the primary focus point when the pulse is fired is manifested in a lower-than-expected level of EUV energy being generated from the droplet.

Due to the effect of the pressure waves on the droplets over the course of a burst of the LPP EUV system, the EUV energy generated exhibits an oscillation having a periodic character. The periodic oscillation is characterized as occurring at a fundamental frequency and harmonic frequencies of the fundamental frequency. As explained herein, the fundamental frequency is a function of the droplet time-of-flight from the droplet generator to the primary focus point in the LPP EUV source plasma chamber.

Iterative learning controllers (ILCs) can be used to control systems that operate in a burst mode and/or are subject to a periodic disturbance, or possess periodic orbits. To correct for the periodic disturbance in the LPP EUV system, an ILC is implemented to control the droplet generator. When the LPP EUV system is operating in the burst mode, the ILC uses data collected about a completed burst to calculate a new set of inputs for a subsequent burst. The ILC calculates the new set of inputs based on a set of inputs from the completed burst and error data from the completed burst.

Figure 1:
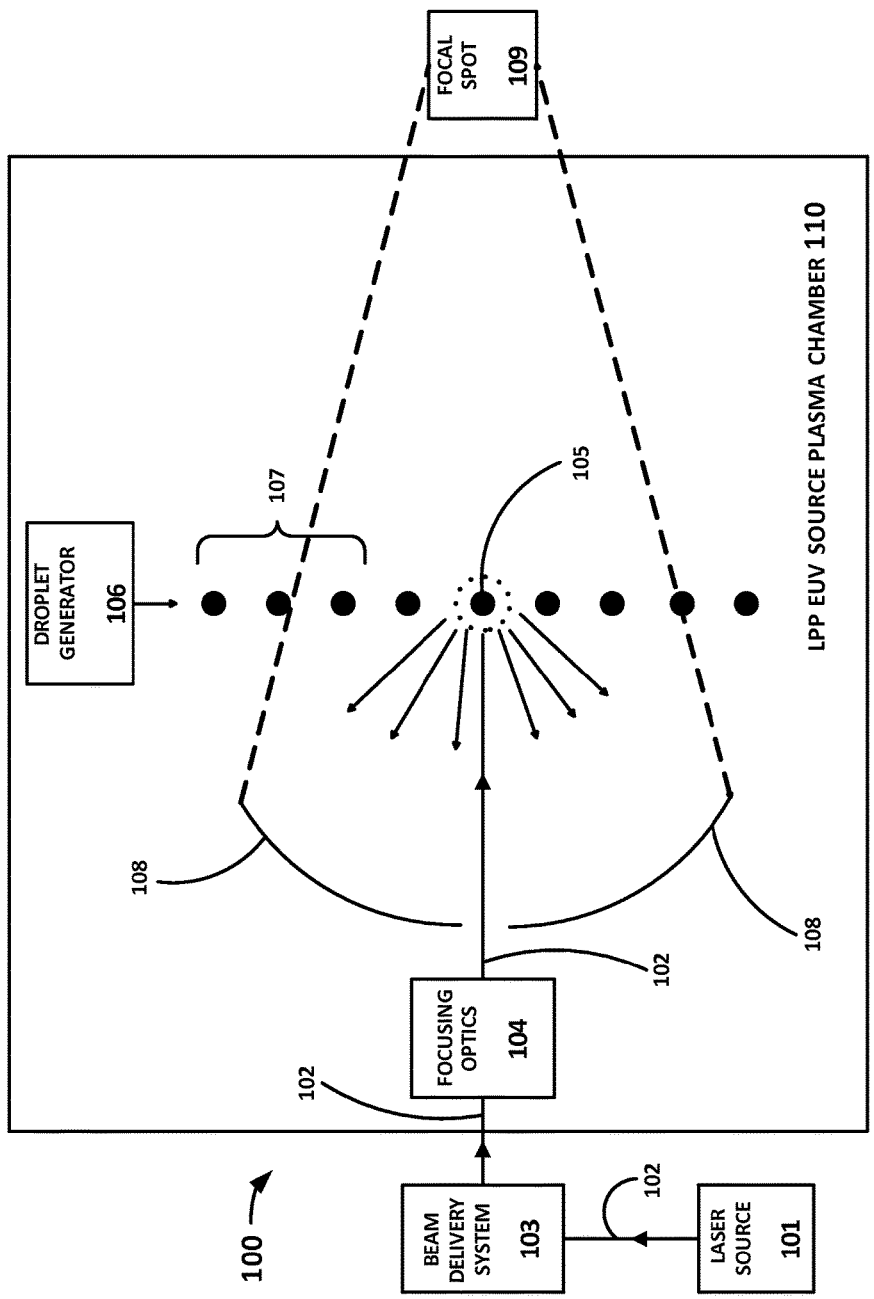
FIG. 1 is a diagram of a portion of an LPP EUV system according to the prior art.
Figure 2:
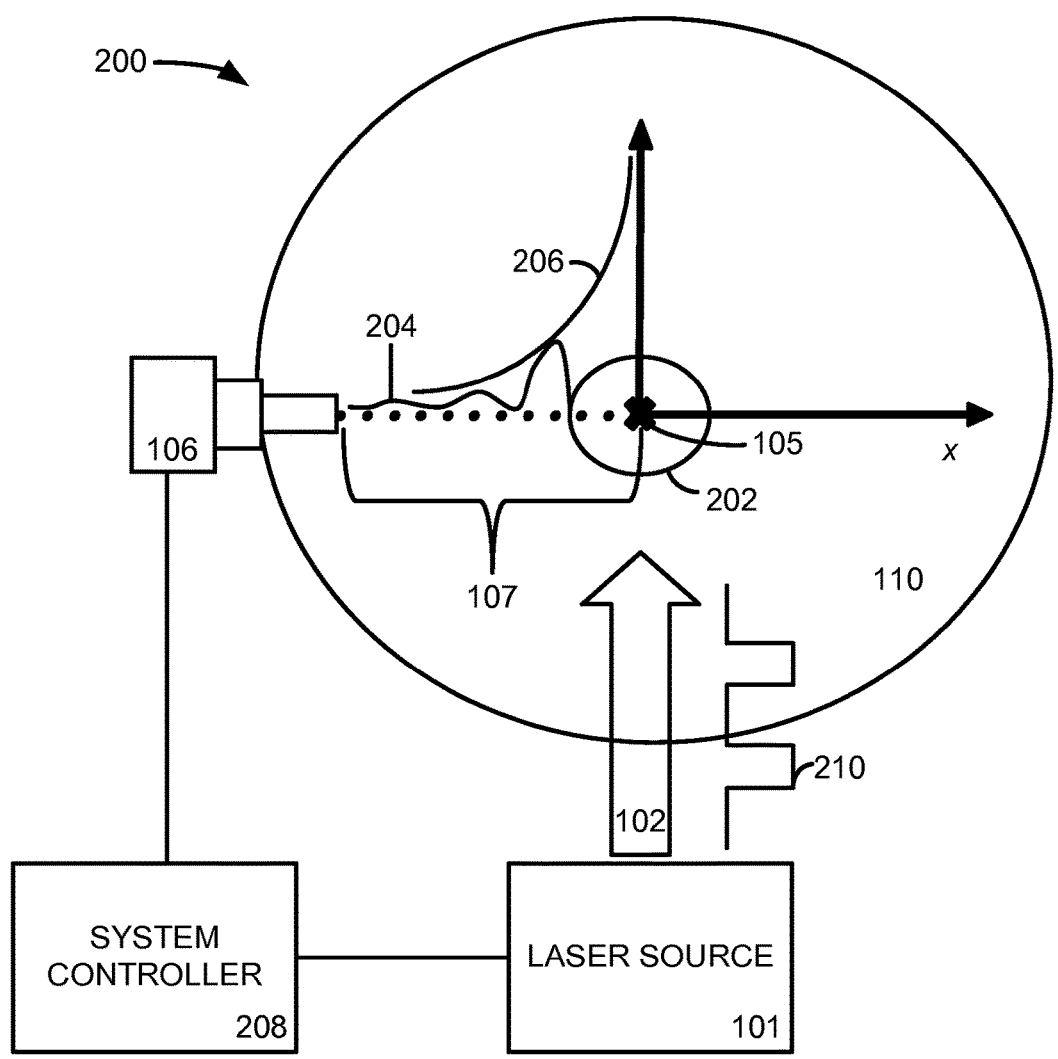
FIG. 2 is a diagram of a portion of an LPP EUV system, according to an embodiment.

FIG. 2 is a diagram of a portion of an LPP EUV system 200, according to an embodiment. A laser source 101, such as a $CO_2$ laser, produces a pulsed laser beam 102 that passes through a beam delivery system (shown in FIG. 1) and through focusing optics comprising a lens and a steering mirror (shown in FIG. 1). As depicted, the pulsed laser beam 102 is in the form of a square wave 210. The pulsed laser beam 102 is directed to a primary focus point 105 within an LPP EUV source plasma chamber 110. A droplet generator 106 produces droplets 107 of an appropriate target material that, when hit by a pulse of the pulsed laser beam 102 at the primary focus point 105, generate a plasma bubble 202 which irradiates EUV light. In one embodiment, a system controller 208 coordinates the timing of the droplets 107 generated by the droplet generator 106 and the pulses of the pulsed laser beam 102 generated by the laser source 101. A sensor (not shown) measures an EUV energy generated from the plasma bubble 202. The generated EUV light is then delivered to, e.g., a lithography scanner system (not shown) containing wafers that are to be exposed to the EUV light. In various implementations, plasma chamber 110 is evacuated of air to avoid absorption of the generated EUV light. In various situations, a buffer gas may be present in the chamber. For example, a hydrogen buffer gas flow may be used for preventing accumulation of target debris.

In operation, the generated plasma forms the plasma bubble 202 around the primary focus point 105. The plasma bubble 202 persists between pulses of the pulsed laser beam 102. When the plasma bubble 202 is hit by one of the droplets 107, a pressure wave 204 (depicted in the figure as a decaying waveform and characterized by an envelope 206) may form and may propagate within a buffer gas in the LPP EUV source plasma chamber 110 back towards the droplet generator 106. As depicted, the pressure wave 204 diminishes as a function of distance from the plasma bubble 202 according to a sinusoidal function. Due to the pressure wave 204, the velocity of droplets 107 conveyed to the plasma bubble 202 from the droplet generator 106 slows. The slowing of the droplets 107 modulates the time of arrival of the droplets at the primary focus point 105. Effects of other disturbances originating from the generated plasma and affecting flight dynamics of the incoming droplets may produce similar qualitative effects on the process of EUV. Hence, the same ILC controller concept presented here can be used to compensate for their effects as well.

Unless compensated for, the slowing of the droplets 107 causes each droplet to not yet reach the primary focus point 105 when the pulsed laser beam 102 is fired at the primary focus point 105. The pulse of the laser beam 102 may only partially hit the droplet or may not hit the droplet at all. Because the droplet is not or only partially hit by the laser beam 102, it is not completely irradiated and less EUV energy is generated than would have been generated had the droplet been completely irradiated. The amount of EUV energy generated is proportional to the distance of the subject droplet from the primary focus point 105 when the pulsed laser beam 102 is fired at the primary focus point 105.

Figure 3:
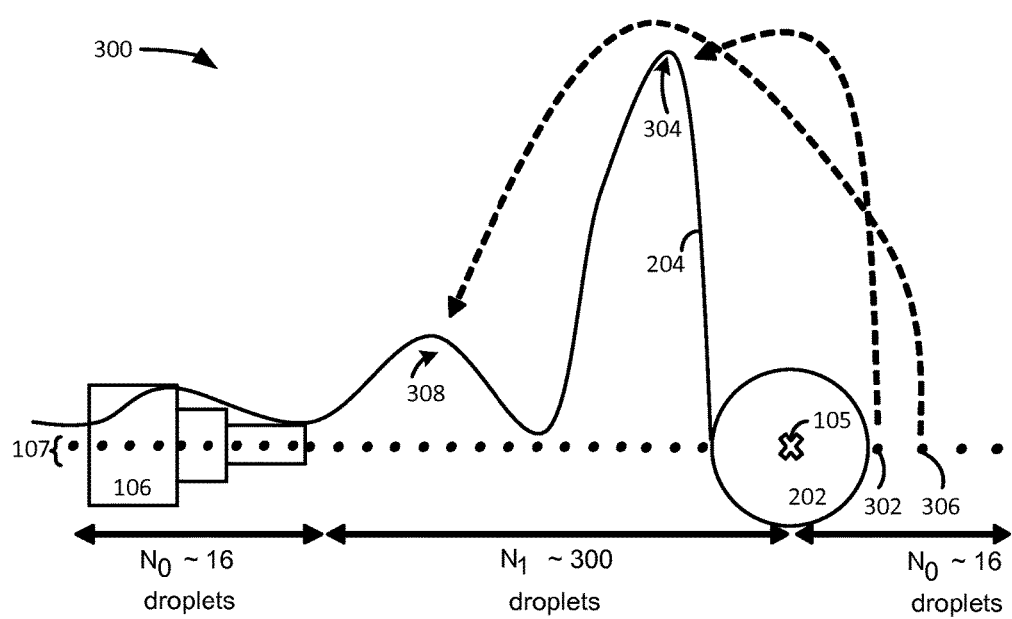
FIG. 3 is a diagram of a series of droplets within the LPP EUV source plasma chamber and the droplet generator, according to an embodiment.

FIG. 3 is a diagram 300 of a series of droplets 107 within the LPP EUV source plasma chamber 110 and the droplet generator 106, according to an embodiment. While not-to-scale, FIG. 3 illustrates how the series of the droplets 107 cause a pressure wave 204 which affects the dynamics of the flight of each of the droplets 107 from the droplet generator 106 to the primary focus point 105.

The arrival of a droplet at the primary focus point 105 is determined by the interactions of the droplet with the pressure wave 204. Once leaving the droplet generator 106, a droplet conveyed to the primary focus point 105 collides with two sets of pressure waves 204. The first set (caused by the droplets 107 labelled "$N_0$") includes pressure waves 204 already propagating through the LPP EUV source plasma chamber 110 when the conveyed droplet is generated. The second set (caused by the droplets 107 labelled "$N_1$") includes pressure waves 204 originating from the droplets 107 preceding the conveyed droplet that will hit the plasma bubble 202 while the conveyed droplet is en route to the primary focus point 105.

The droplets 107 that have already impacted the plasma bubble 202 are designated as $N_0$ and depicted to the right of the primary focus point 105. As illustrated in FIG. 3, a first preceding droplet 302 causes a first (and highest) peak 304 in the pressure wave 204. A second preceding droplet 306 causes a second peak 308 in the pressure wave 204 that has a diminishing amplitude as the pressure wave propagates through the LPP EUV source plasma chamber 110. In this example, the first two peaks 304 and 308 affect approximately 158 incoming droplets as depicted. Those droplets 107 that will cause pressure impulses to originate from the plasma bubble 202 hit the plasma bubble 202 while the subsequently conveyed droplet is en route to the primary focus point 105 and are designated as droplets $N_1$ of FIG. 3.

The number $N_0$ of the droplets that have already impacted the plasma bubble 202 and caused a pressure wave that affects the migration of the conveyed droplet to the primary focus point 105 is:

$$N_0 = \frac{l}{\lambda_p} = \frac{lf_H}{C_s}$$

where l denotes the distance of the droplet generator 106 from the primary focus point 105, $\lambda_p$ is the wavelength of the pressure wave 204, $C_S$ is the velocity of the pressure wave 204, and $f_H$ is the frequency at which the droplets are hit by the pulses of the laser beam 102. The total number of collisions of the conveyed droplet with the pressure wave 204 is defined as:

$$N = N_1 + N_0 = \frac{l}{d_s} + \frac{l}{\lambda_p} = \frac{lf_H}{v_0} + \frac{lf_H}{C_s}$$

where $d_s$ denotes the distance between the droplets and $v_0$ denotes the velocity of the droplets when they are released by the droplet generator 106.

As is known to those skilled in the art, in a master-oscillator power-amplifier (MOPA) LPP EUV system 200, the power of the pulse of the laser beam 102 fired at a droplet 107 is assumed to be constant for each of the droplets 107. Based on this assumption, one of skill in the art can assume that the amount of EUV energy generated by the droplet 107, once hit by the pulse of the laser beam 102, is dependent on the position of the droplet 107 relative to the primary focus point 105 at the time of laser fire.

The distance of a particular droplet 107, referred to as the "$i^{th}$ droplet", from the primary focus point 105 at the time of fire of the pulsed laser beam 102 at the $i^{th}$ droplet is denoted as $\Delta(i)$. Assume that the energy EUV(i) generated by the $i^{th}$ droplet 107 is a function of $\Delta(i)$, EUV$(i)=f(\Delta(i))$, and that the above relationship is a symmetric function, i.e. that $f(\Delta(i))=f(-\Delta(i))$.

Assuming that the magnitudes of the pressure waves caused by the droplets 107 are proportional to the EUV energy generated by the $i^{th}$ droplet 107, one of skill in the art can define the following autonomous discrete system describing the droplet displacements ($\Delta(i)$) at the time of laser fire, and the related EUV energy production (EUV(i)) law:

$\Delta(i)=F_\Delta(\Delta(i-1),\Delta(i-1), \ldots \Delta(i-N))$,

EUV$(i)=F_{EUV}$(EUV$(i-1)$,EUV$(i-1), \ldots$,EUV$(i-N)$).

At this point one of skill in the art is not concerned with the actual form of the functions $F_\Delta:R^N \to R$, and $F_{EUV}:R_+^N \to R_+$ but only with their dimensionality. A standard mathematical nomenclature is used here to indicate these functions, and shall be interpreted as follows: $F_\Delta:R^N \to R$ means that the function $F_\Delta$ maps an N dimensional vector of real numbers on a scalar real number. Similarly, $F_{EUV}:R_+^N \to R_+$ means that the function $F_{EUV}$ maps an N dimensional vector of real positive numbers on a real positive scalar value. Note that the number of states of these systems is equal to N, where N denotes the total number of droplets fired before the $i^{th}$ droplet that have effect on its flight dynamics.

A state vector $X(i) \in R^N$, where X(i) is an N dimensional vector of real numbers, of this system can be defined as follows:

$$X(i) = \begin{bmatrix} \Delta(i-1) \\ \vdots \\ \Delta(i-N) \end{bmatrix}$$

The system can now be represented using the following state space form:

$X(i+1)=F(X(i))$

Indicating that vector X(i+1) can be found as a vector-valued function, F(••), of the vector X(i)).

In a "no master oscillator" (NOMO) configuration of the LPP EUV system operation, where the reflectance of droplet 107 is used to form a laser cavity, the presence of a droplet 107 at focus point 105 triggers the pulse of the laser beam 102. In this configuration, the velocity of the droplet 107 in the chamber may affect the power of the pulse thereby created.

Hence, the amount of the EUV energy created by the $i^{th}$ droplet in a NOMO-configured system is a function of not only its position, $\Delta(i)$, at the time of the laser fire, but also of the speed of the $i^{th}$ droplet, V(i), at the time the $i_{th}$ droplet crosses a triggering curtain.

EUV$(i)=f(\Delta(i),V(i))$

Note that the number of states of this system is equal to 2×N, where N denotes the total number of droplets fired before the $i^{th}$ droplet that have effect on flight dynamics of the $i^{th}$ droplet.

Thus, both the MOPA and the NOMO configurations of an LPP EUV system may have disturbances with a fundamental frequency that may depend on droplet dynamics. The dynamics of LPP EUV system 200 may have, therefore, one or more orbits that affect locations of droplets at the time the laser beam 102 is fired. To determine the orbits of the LPP EUV system 200, assume that the LPP EUV system 200 admits a periodic orbit Y with periodicity p. In other words, assume that there exists an integer number p∈1, such that, if the system state X(i)=Y, then $X(i+p)=F \circ F \circ F \circ F \circ F \ldots \circ F(X(i)) = \mathcal{F}(X(i)) = \mathcal{F}(Y)$
$=X(i)=Y$ where the function composition operator "∘" is applied p−1 times. Note that the dimension of the orbit $Y \in R^n$ is the same as that of the state vector X(i).

Figure 4A:
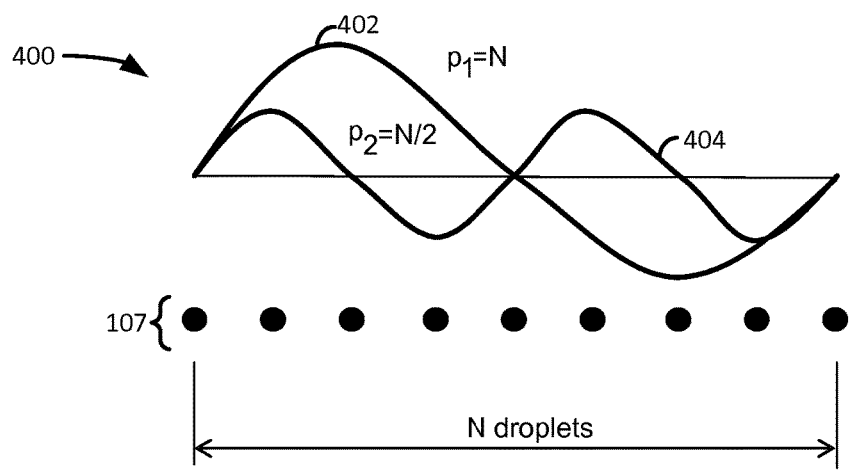
FIG. 4A is a diagram depicting orbitals of displacement of droplets within the LPP EUV source plasma chamber, according to an embodiment.

FIG. 4A is a diagram 400 depicting the orbitals of the LPP EUV system 200 that predict the displacement of droplets 107 within the LPP EUV source plasma chamber 110, according to an embodiment. Based on the conclusion that if the system describing the relative displacement of the droplets 107 from the primary focus point 105 at the time of fire has periodic orbits, those orbits are defined by N-dimensional orbit vector Y with associated periodicity, p. Consequently, if an orbit exists in the discrete system of $N^{th}$ order, where N is a number of droplets affecting a velocity of first droplet, the highest possible associated period of the spectral component of the orbit is $p_1=N$, depicted by curve 402 shown in FIG. 4A. The first higher order harmonics of this fundamental period has a period, such as $p_2=N/2$, and is depicted by curve 404.

Figure 4B:
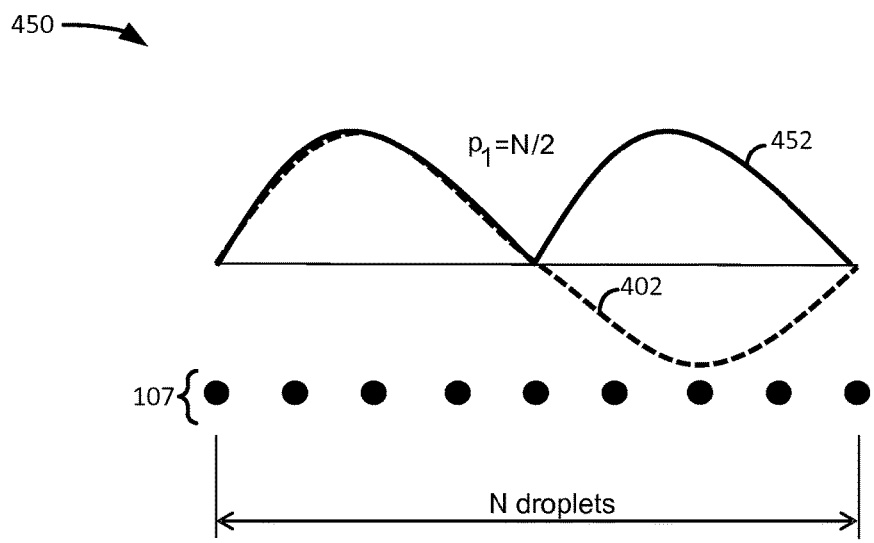
FIG. 4B is a diagram depicting orbitals of EUV energy within the LPP EUV source plasma chamber, according to an embodiment.

FIG. 4B is a diagram 450 depicting orbitals of EUV energy within the LPP EUV source plasma chamber 110, according to an embodiment. Recall that it was assumed that the relationship between the EUV energy produced by the $i^{th}$ droplet 107 is a symmetric function of the displacement $\Delta(i)$. This implies that the spectral components of the orbits of the EUV energy could have the form indicated by curve 452, which is the absolute value of curve 402, where the period, p, is half of N number of droplets.

Consequently, the period, $T_{max}$ and frequency, $f_{min}$, of the lowest frequency component in the EUV spectra are defined by:

$$T_{max} = \frac{N}{2f_H} = \frac{1}{2f_H}\left(\frac{f_H l}{v_0} + \frac{lf_H}{C_s}\right) = \frac{1}{2}\left(\frac{l}{v_0} + \frac{l}{C_s}\right) = \frac{1}{2}\frac{C_s + v_0}{v_0 C_s}$$

$$f_{min} = f_1 = \frac{1}{T_{max}} = \frac{2}{l}\frac{v_0 C_s}{C_s + v_0}$$

In one embodiment, the distance from droplet generator 106 to the primary focus point 105 is l=0.347m. The droplet initial velocity is $$v_0 = 57.9\frac{m}{s}.$$

The speed of sound in the hydrogen buffer gas inside the LPP EUV source plasma chamber 110 is $$C_s = 1023\frac{m}{s}$$

(meters per second) corresponding to the temperature of 295 Kelvin. Thus, the fundamental frequency in the EUV spectra is expected to be $f_{min}=f_1=316$ Hz. Higher harmonics can be expected at frequencies that are integer multiples of the base frequency, $f_j=jf_1$. Note that for $$v_0 = 6.28\frac{m}{s}$$

the fundamental frequency would have the frequency of $f_{min}=f_1=341$ Hz.

The mathematical equations above can be used to predict that, for the NOMO mode for which the dimension of the state is twice as large as that of the MOPA mode, the fundamental frequency of the periodic orbits is $$f_{min}^{NOMO} = \frac{f_1}{2} = 158 \text{ Hz}.$$

Figure 5:
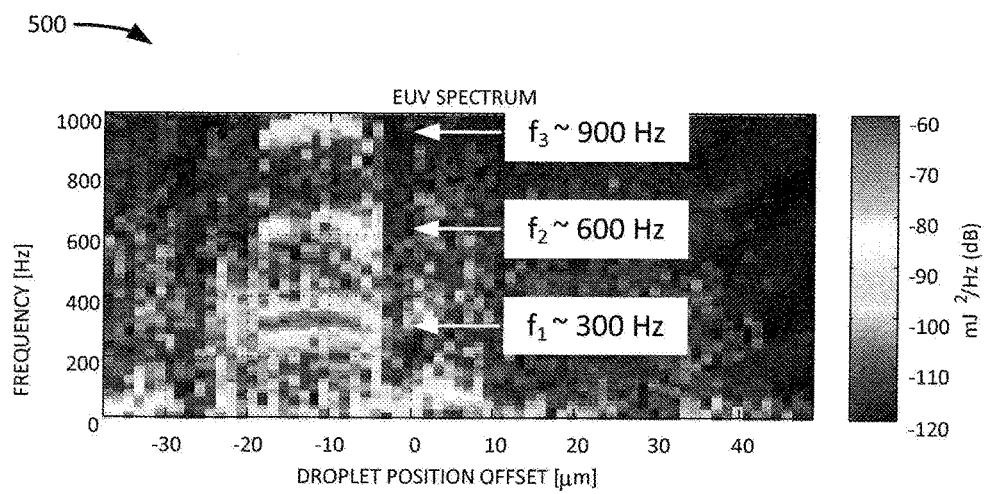
FIG. 5 is a graph indicating frequencies of a periodic disturbance in the LPP EUV system.

FIG. 5 is a graph 500 indicating frequencies of a periodic disturbance in the LPP EUV system 200. The periodic disturbance in the generated EUV light is observed when the conveyed droplet is between about 5 and 20 micrometers from the primary focus point 105 when the pulse of the laser beam 102 is fired. As predicted by the equations above and as shown in the figure, the first disturbance in the EUV spectra is at approximately 300 Hz. The graph 500 further indicates the presence of harmonic tones $f_2$ and $f_3$ at approximately 600 Hz and 900 Hz, respectively.

Figure 6:
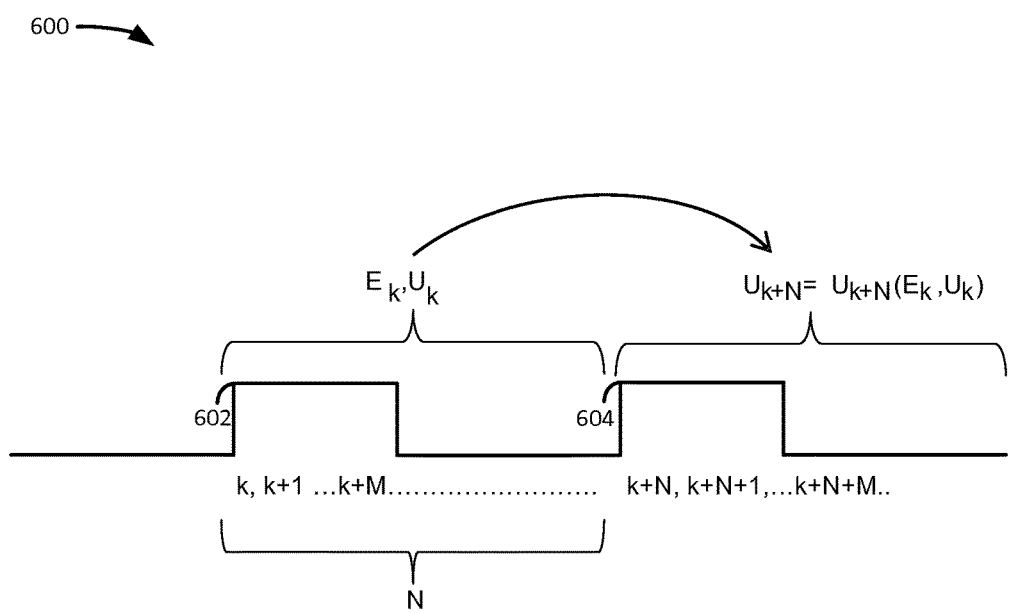
FIG. 6 is a diagram of bursts of the LPP EUV system.

FIG. 6 is a diagram of a bursts 600 occurring in the LPP EUV system 200. For the purposes of this disclosure, bursts 600 can occur either when the LPP EUV system 200 is operating in a burst mode where, as understood by one of skill in the art, each burst is a series of pulses occurring within a duration of time, typically as dictated by the EUV source gate as specified by a scanner, or when the LPP EUV system 200 is operating in a mode of continuous production of EUV light with no gaps between bursts in which case the bursts are defined by the number of pulses that occur in each burst. In either case, each burst is one of the pre-defined number of generated droplets 107 associated with an equal number of pulses of the laser beam 102. As shown, each burst begins at a rising edge of burst 602 and 604 of the bursts 600.

The burst mode may lead to a repetitive or periodic behavior in addition to, or instead of, the periodic behavior described above (arising form the N-droplet dynamics). Thus, burst modes, droplet dynamics, or other factors may cause periodic disturbances. As shown in the figure, a first burst 602 of the bursts 600, has a total number of laser shots, $N_{LS}$, each associated with a droplet. Each laser shot increments the number of laser shots by 1. The first burst 602 begins with laser shot k and ends with laser shot k+M. A second burst 604 then begins at laser shot k+N and ends with laser shot k+N+M. While M and N are simply variables, in light of the teachings herein it is to be understood that continuous EUV production can be regarded as a special case of a burst mode where if M=N then the EUV source is operating in continuous mode rather than in burst mode with no gaps in EUV production between one burst and a subsequent burst.

During operation, at least two types of data about a completed burst are collected by the LPP EUV system 200. The first is an error value, $E_k$, for each hit k. The error value is a difference between a desired or expected output of EUV energy and an actual output. As discussed above, this error is due at least in part to a periodic disturbance in the LPP EUV system 200, as shown in FIG. 5. When uncompensated for, the periodic disturbance is caused by a variation of a distance of the droplet 107 from the primary focus point 105 when the laser source 101 fires at the primary focus point 105. The second type of data collected by the LPP EUV system 200 is a set of control signals, $U_k$, that were provided by the system controller 208 to the droplet generator 106 or the laser source 101 during the completed burst.

According to various embodiments, the data collected about the complete burst (e.g., first burst 602) are used by the system controller 208 to determine or update the control signals provided to the droplet generator 106 or the laser source 208 for the next burst (e.g., the second burst 604). The control signals are updated on a burst-by-burst basis (e.g., from one burst to the next, regardless of whether the EUV source is operating in burst or continuous mode) where information about the first burst 602 is used to determine control signals for the second burst 604. The control signals can instruct the droplet generator 106 or the laser source 101 within the LPP EUV system 200. These instructions may include, for example, delays or advances in the timing of droplet launches or laser shots, steering of laser beam 102 or droplet generator 106, or changes in droplet velocity, or combinations thereof.

Figure 7:
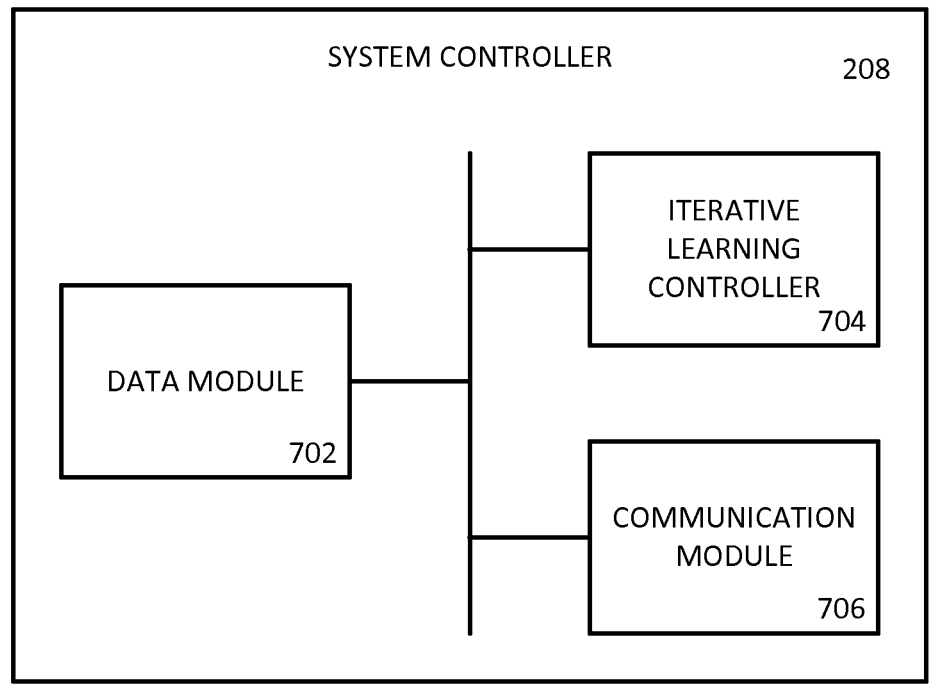
FIG. 7 is a block diagram of a system controller, according to an embodiment.

FIG. 7 is a block diagram of the system controller 208, according to an embodiment comprising a data module 702, an iterative learning controller 704, and a communication module 706. The system controller 208 obtains the data about a completed burst of the LPP EUV system 200 and provides control signals instructing the droplet generator 106 or the laser source 101 during a current cycle. The system controller 208 is configured to compensate for error due to a periodic disturbance in EUV energy generated by the LPP EUV system 200. When uncompensated for, the periodic disturbance causes a variation of a distance of the droplet 107 from the primary focus point 105 when the laser source 101 fires a pulse of the laser beam 102 at the primary focus point 105.

The system controller 208 may be implemented in a variety of ways known to those skilled in the art including, but not limited to, as a computing device having a processor with access to a memory capable of storing executable instructions. The computing device may include one or more input and output components, including components for communicating with other computing devices via a network or other form of communication. The system controller 208 comprises one or more modules embodied in computing logic or executable code.

The data module 702 is configured to obtain data about a completed burst (e.g., the first burst 602 of FIG. 6) of the LPP EUV system 200. The obtained data comprises the control signals used to instruct the LPP EUV system 200 during the completed cycle. The control signals can be expressed as a control signal vector, $U_k$, containing an indication of the control signal provided at each time, k, during the completed burst. In an example embodiment, the control signal vector is in the form:

$$U_k = \begin{bmatrix} u(k) \\ u(k+1) \\ u(k+N-1) \end{bmatrix}$$

The obtained data further includes an indication of error occurring during the completed burst. The error is calculated as a difference between a desired output and an actual output. To calculate the difference, a number N of consecutive actual outputs $y(k)$ and desired outputs $y^d(k)$ are collected. The error $e(k)$ of the output EUV energy is calculated according to the equation:

$$e(k) = y^d(k) - y(k)$$

These values are expressed as vectors having the respective forms:

$$Y_k = \begin{bmatrix} y(k) \\ y(k+1) \\ y(k+n-1) \end{bmatrix}, Y_k^d = \begin{bmatrix} y^d(k) \\ y^d(k+1) \\ y^d(k+N-1) \end{bmatrix}, E_k = \begin{bmatrix} e(k) \\ e(k+1) \\ e(k+N-1) \end{bmatrix}$$

The iterative learning controller (ILC) 704 is configured to generate the control signal vector based on the first control signal vector and the first error vector. The ILC is used to update the control signal vector for a subsequent burst (e.g., the second burst 604 of FIG. 6) after a completed burst (e.g., the first burst 602) according to an ILC update formula:

$$U_{k+N} = U_k - \Gamma E_k = U_k - \Gamma(Y_k^d - Y_k).$$

Where $U_{k+N}$ is the updated control signal vector for a subsequent burst, $U_k$ is the control signal vector for the completed burst, $\Gamma$ (gamma) is a learning gain matrix, $E_k$ is the error vector of the completed burst, $Y_k^d$ is the desired output vector of the completed burst, and $Y_k$ is the actual output vector of the completed burst. In the LPP EUV system 200, the learning gain matrix is selected to cause the actual output vector of the LPP EUV system 200 to converge at the desired output vector. The learning gain matrix $\Gamma$ can be calculated by the system controller 208 or by an operator of the LPP EUV system 208.

The ILC 704 operates to cause the convergence of the LPP EUV system 200 to its desired output values, as can be seen by computing the error vector of a subsequent burst using the system input-output map and the ILC update formula:

$$E_{k+N} = Y_{k+N}^d - Y_{k+N} = Y_{k+N}^d - HU_{k+N} = Y_{k+N}^d - H(U_k + \Gamma(Y_k^d - Y_k))$$

where $E_{k+N}$ is the error vector of the subsequent burst, $Y_{k+N}^d$ is the desired output vector of a subsequent burst, $Y_{k+N}$ is the actual output vector of the subsequent burst, H is a system state matrix, $U_{k+N}$ is the updated control signal vector for a subsequent burst, $U_k$ is the control signal vector for the completed burst, $\Gamma$ is the learning gain matrix, $Y_k^d$ is the desired output vector of the completed burst, and $Y_k$ is the actual output vector of the completed burst.

In operation, bursts in the LPP EUV system 200 are periodic. The desired output across bursts is unchanging from burst-to-burst so that:

$$Y_{k+N}^d = Y_k^d$$

Using substitution, the error vector for the subsequent burst can then be re-written as:

$$E_{k+N} = Y_{k+N}^d - Y_{k+N} = Y_k^d - HU_k - H\Gamma(Y_k^d - Y_k) = Y_k^d - Y_k - H\Gamma(Y_k^d - Y_k)$$

where $E_{k+N}$ is the error vector of the subsequent burst, $Y_{k+N}^d$ is the desired output vector of a subsequent burst, $Y_{k+N}$ is the actual output vector of the subsequent burst, H is the system state matrix, $U_k$ is the control signal vector for the completed burst, $\Gamma$ is the learning gain matrix, $Y_k^d$ is the desired output vector of the completed burst, and $Y_k$ is the actual output vector of the completed burst. The error vector of the subsequent burst can be rewritten as:

$$E_{k+N} = E_k - H\Gamma E_k = (1 - H\Gamma)E_k$$

where $E_{k+N}$ is the error vector of the subsequent burst, $E_k$ is the error vector of the completed burst, H is the system state matrix, and $\Gamma$ is the learning gain matrix.

The ILC 704, using an appropriate choice of the learning gain matrix $\Gamma$, as understood by one of skill in the art in light of the teachings herein, will cause the error vector to stabilize, implying that $$\lim_{k \to \infty} E_k = 0 \Longrightarrow \lim_{k \to \infty} Y_k = Y_k^d.$$

where $E_k$ is the error vector of the completed burst, $Y_k$ is the actual output vector of the completed burst, and $Y_k^d$ is the desired output vector of the completed burst. One approach to choosing the learning gain matrix is to select a matrix $\Gamma$ such that, for example, the matrix 1−HΓ has no eigenvalues with magnitude greater than unity.

According to the above equations and assumptions, the ILC 704 is able to determine an updated control signal vector for a subsequent burst when the LPP EUV system 200 is operating. The ILC 704 is used to reduce the amount of error due to a periodic disturbance caused by a variation of a distance of a droplet 107 from the primary focus point 105 when the laser source 101 fires a laser pulse at the primary focus point 105.

The communication module 706 is configured to communicate the updated control signal vector, $U_{k+N}$, generated by the ILC 704 to the droplet generator 106 for a second burst 604. In some instances, the system controller 208 comprises at least one additional controller (not shown) that determines an input to the LPP EUV system 200. In an example embodiment, the additional controller comprises a proportional-integral-derivative (PID) controller that calculates a further set of control signals for the LPP EUV system 200. The PID controller may operate in parallel with the ILC controller 704 to generate control signals. In such an embodiment, the communication module 706 may sum or otherwise combine the updated control signal vector generated by the ILC 704 and the control signal generated by the PID controller, as is known in the art. In such a configuration, the PID controller would generate the same type of control signals that the ILC 704 generates, except that the PID controller output is generated and updated once per droplet/laser shot while the ILC controller updates its outputs in a batch mode once every N droplets, and then applies those N control values over the subsequent N droplets. For example, if the output of the ILC controller is the timing of the laser firing, output of the PID would also be timing of the laser firing. If the output of ILC is the timing of droplet generation, output of the PID would also be timing of droplet generation. If the output of ILC is a command to the laser to change its position, output of the PID would also be a command to the laser to change its position, etc.

Figure 8:
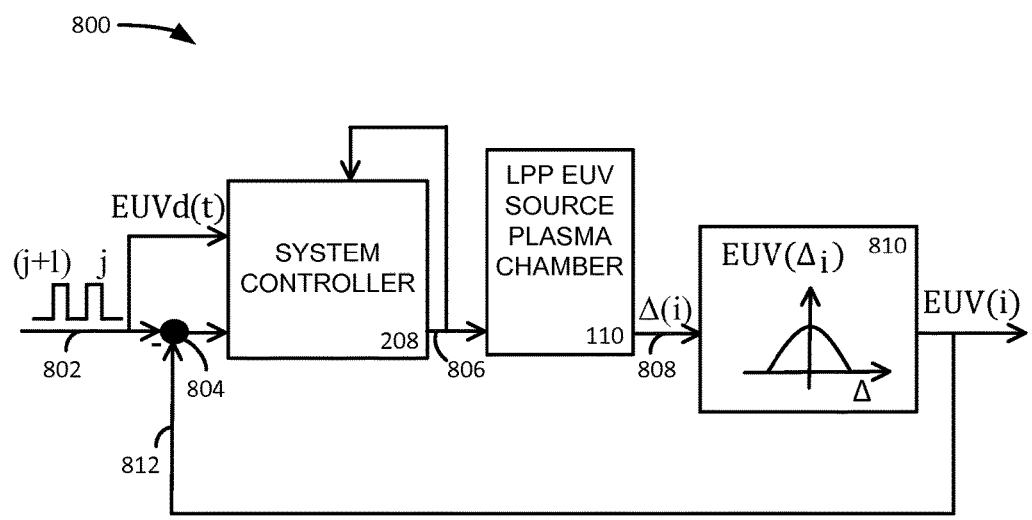
FIG. 8 is a diagram of a portion of the LPP EUV system, according to an embodiment.

FIG. 8 is a diagram of a portion of an LPP EUV system 800, according to an embodiment. As depicted, the LPP EUV system 800 may form part of the LPP EUV system 200 and include portions of the LPP EUV system 200. The LPP EUV system 800 has bursts as indicated by the waveforms labelled j and (j+1).

The LPP EUV system 800 receives a signal indicating a desired amount 802 of EUV light to be generated (labeled "EUVd(t)") during the burst. The signal is provided to the controller 208. Also provided to the controller 208 is an error 804 calculated from an actual amount 812 of EUV light generated (labeled "EUV(i)") during a previous burst. The error 804 is calculated as the difference between the desired amount 802 and the actual amount 812 of EUV generated. In some instances, the desired amount 802 of EUV light generated does not change from burst-to-burst.

The system controller 208, at a rising edge of a burst, determines control signals 806. The system controller 208 sends the control signal 806 to the LPP EUV source plasma chamber 110. The system controller 208 includes an ILC 704 to determine a control signal vector. As explained elsewhere, the controller 208 may include one or more additional controllers, such as a PID controller. The control signals 806 are also fed back to the system controller 208.

The control signals 806 generated by the system controller 208 are received by LPP EUV source plasma chamber 110. The control signals 806 control the various components of the LPP EUV source plasma chamber 110 such as a droplet generator 106 and a laser source 101. As explained elsewhere, the distance of the $i^{th}$ droplet 107 from the primary focus point 105 at the time of fire of the pulse of the laser beam 102 at the droplet 107 is denoted by $\Delta(i)$ 808. The actual amount 812 of the EUV generated by the $i^{th}$ droplet 107 may be expressed as a symmetric function 810. In various implementations, asymmetric functions may be used instead. The distance $\Delta(i)$ 808 and the symmetric function 810 are assumed to be manifested in the values of the actual amount 812 of the EUV generated that is fed back to the LPP EUV system 800.

Figure 9:
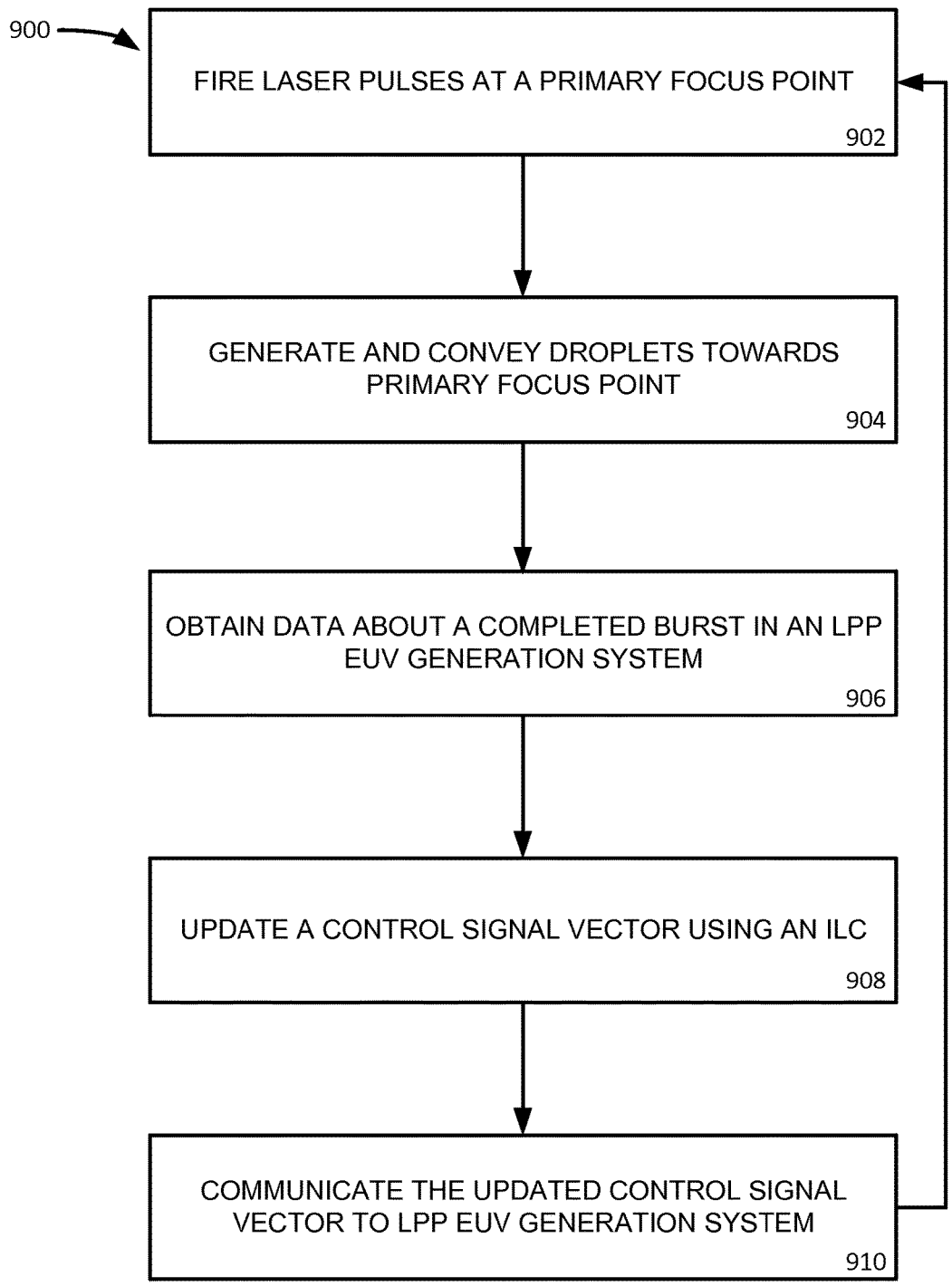
FIG. 9 is a flowchart of a method for reducing periodic disturbances in the LPP EUV system.

FIG. 9 is a flowchart of a method 900 for reducing periodic disturbances in an LPP EUV system, such as the LPP EUV system 200 or 800. The method 900 may be performed by, for example, the system controller 208.

In an operation 902, pulses of the laser beam 102 are fired at the primary focus point 105 within the LPP EUV source plasma chamber 110 of the LPP EUV system 200 or 800. The pulses may be generated and fired as described herein during a burst when the laser source 101 is operating in either a burst mode or a continuous mode.

In an operation 904, the droplets 107 are generated and conveyed towards the primary focus point 105 within the LPP EUV source plasma chamber 110 by, for example, the droplet generator 106.

In an operation 906, data about a completed burst in an LPP EUV system is obtained. The data is obtained by receiving the data from the LPP EUV system 200 or 800 or a component thereof, by accessing stored data, or through other techniques known in the art. The obtained data may include a control signal vector, a desired output matrix, an actual output matrix, a learning gain matrix, and other data discussed herein. The data may be obtained by, for example, the data module 702.

In an operation 908, a control signal vector is updated using an ILC, such as ILC 704. The control signal vector can be updated at the rising edge occurring at the beginning of a burst while the LPP EUV system 200 or 800 operates. The control signal vector is updated so as to reduce error caused by a periodic disturbance in the LPP EUV system 200 or 800.

In an operation 910, the updated control signal vector is communicated to the LPP EUV system 200 or 800 by, for example, the communication module 706. The updated control signal vector is communicated to the droplet generator 106 or the laser source 101. In some instances, the updated control signal vector is combined with control signals generated by additional controllers, such as a PID controller. The control signal is used to modify the timing of droplet launches or laser shots, steering of laser beam 102 or droplet generator 106, or changes in droplet velocity, or combinations thereof. The process then repeats by returning to operation 902.

The disclosed method and apparatus has been explained above with reference to several embodiments. Other embodiments will be apparent to those skilled in the art in light of this disclosure. Certain aspects of the described method and apparatus may readily be implemented using configurations other than those described in the embodiments above, or in conjunction with elements other than those described above. For example, different algorithms and/or logic circuits, perhaps more complex than those described herein, may be used, as well as possibly different types of MOPA systems or NOMO systems. Although effects of acoustic disturbances and burst modes on droplet flight are elaborated in detail in this application, they are discussed herein primarily as examples to describe the structure of the droplet dynamics present in LPP EUV sources that dominate and drive the need for the proposed ILC treatment. Effects of other impulsive plasma generated disturbances such as ion winds result in similar dynamic effects consistent with the use of ILC because they result in qualitatively similar dynamic effects on the droplets. These examples illustrate the structure of the droplet flight dynamics and to illustrate how and why ILC control paradigm can be used for control in LPP EUV sources.

Further, it should also be appreciated that the described method and apparatus can be implemented in numerous ways, including as a process, an apparatus, or a system. The methods described herein may be implemented by program instructions for instructing a processor to perform such methods, and such instructions recorded on a non-transitory computer readable storage medium such as a hard disk drive, floppy disk, optical disc such as a compact disc (CD) or digital versatile disc (DVD), flash memory, etc., or communicated over a computer network wherein the program instructions are sent over optical or electronic communication links. It should be noted that the order of the steps of the methods described herein may be altered and still be within the scope of the disclosure.

It is to be understood that the examples given are for illustrative purposes only and may be extended to other implementations and embodiments with different conventions and techniques. While a number of embodiments are described, there is no intent to limit the disclosure to the embodiment(s) disclosed herein. On the contrary, the intent is to cover all alternatives, modifications, and equivalents apparent to those familiar with the art.

In the foregoing specification, the invention is described with reference to specific embodiments thereof, but those skilled in the art will recognize that the invention is not limited thereto. Various features and aspects of the above-described invention may be used individually or jointly. Further, the invention can be utilized in any number of environments and applications beyond those described herein without departing from the broader spirit and scope of the specification. The specification and drawings are, accordingly, to be regarded as illustrative rather than restrictive. It will be recognized that the terms "comprising," "including," and "having," as used herein, are specifically intended to be read as open-ended terms of art.

What is claimed is:

1. A laser-produced plasma (LPP) extreme ultraviolet (EUV) system comprising:
    a laser source configured to fire laser pulses at a primary focus point within an LPP EUV source plasma chamber of the LPP EUV system, during a first burst when the LPP EUV system is operating;
    a droplet generator configured to generate and convey droplets towards the primary focus point within the LPP EUV source plasma chamber; and
    a system controller comprising:
        a data module configured to obtain data about the first burst of the LPP EUV system, the data comprising a first control signal vector and a first error vector, wherein the first error vector is a difference between a first desired output vector and a first actual output vector due at least in part to a periodic disturbance or presence of periodic system orbits in the LPP EUV system,
        an iterative learning controller (ILC) configured to generate a second control signal vector based on the first control signal vector and the first error vector, and
        a communication module configured to communicate the second control signal vector to the laser source or the droplet generator for a second burst.

2. The system of claim 1, wherein the periodic disturbance in the LPP EUV system is caused by a variation of the distance of a first of the generated droplets from the primary focus point when the laser source fires a first of the laser pulses at the primary focus point.

3. The system of claim 1, wherein the presence of the periodic system orbits is caused by a periodicity of generated droplet position relative to the primary focus point when the laser source fires laser pulses at the primary focus point, and wherein the periodicity of generated droplet position relative to the primary focus point is caused by an interaction between one or more of the generated droplets and a disturbance caused by an interaction between previously generated laser pulses and one or more previously generated droplets.

4. The system of claim 1, wherein the first actual output vector indicates an amount of EUV energy generated by the LPP EUV system during the first burst.

5. The system of claim 1, wherein the first desired output vector indicates an expected amount of EUV energy generated during the first burst.

6. The system of claim 5, wherein the first desired output vector is an unchanging set of values.

7. The system of claim 1, wherein the ILC is configured to generate the second control signal vector based on a rising edge of the second burst.

8. The system of claim 1, wherein the ILC is configured to generate the second control signal vector by selecting a learning gain matrix such that the product of the learning gain matrix and the first error vector approaches zero after the second burst.

9. A method comprising:
    firing laser pulses at a primary focus point within a laser-produced plasma (LPP) extreme ultraviolet (EUV) source plasma chamber of an LPP EUV system during a first burst when a laser source is operating;
    generating and conveying droplets towards the primary focus point within the LPP EUV source plasma chamber using a droplet generator;
    obtaining data about the first burst of the LPP EUV system, the data comprising a first control signal vector and a first error vector, wherein the first error vector is a difference between a first desired output vector and a first actual output vector due at least in part to a periodic disturbance or presence of periodic system orbits in the LPP EUV system;
    generating, by a controller, a second control signal vector using an iterative learning controller (ILC), wherein the generating is based on the first control signal vector and the first error vector; and
    communicating the second control signal vector from the controller to laser source or the droplet generator for a second burst.

10. The method of claim 9, wherein the periodic disturbance in the LPP EUV system is caused by a variation of the distance of a first of the generated droplets from the primary focus point when the laser source fires a first of the laser pulses at the primary focus point.

11. The method of claim 9, wherein the presence of the periodic system orbits is caused by a periodicity of generated droplet position relative to the primary focus point when the laser pulses are fired at the primary focus point, and wherein the periodicity of generated droplet position relative to the primary focus point is caused by an interaction between one or more of the generated droplets and a disturbance caused by an interaction between previously generated laser pulses and one or more previously generated droplets.

12. The method of claim 9, wherein the first actual output vector indicates an amount of EUV energy generated by the LPP EUV system during the first burst.

13. The method of claim 9, wherein the first desired output vector indicates an expected amount of EUV energy generated by the LPP EUV system during the first burst.

14. The method of claim 13, wherein the first desired output vector is an unchanging set of values.

15. The method of claim 9, wherein generating the second control signal vector further comprises selecting a learning gain matrix for the ILC such that the product of the learning gain matrix and the first error vector approaches zero after the second burst.

16. The method of claim 9, further comprising:
obtaining data about the second burst as the second control signal vector and a second error vector, wherein the second error vector is a difference between a second desired output vector and a second actual output vector due to the periodic disturbance in the LPP EUV system caused by the variation of the distance of a second of the generated droplets from the primary focus point when the laser source fires a second of the laser pulses at the primary focus point;
generating, by the controller, a third control signal vector using the ILC, wherein the generating is based on the second control signal vector and the second error vector; and
communicating the third control signal vector from the controller to the laser source or the droplet generator for a third burst subsequent to the second burst.

17. The method of claim 9 further comprising the LPP EUV system operating in a burst mode.

18. The method of claim 9 further comprising the LPP EUV system operating in a continuous mode.

19. A non-transitory computer-readable medium having instructions embodied thereon, the instructions executable by one or more processors to perform operations comprising:
firing laser pulses at a primary focus point within a laser-produced plasma (LPP) extreme ultraviolet (EUV) source plasma chamber of an LPP EUV system during a first burst when a laser source is operating;
generating and conveying droplets towards the primary focus point using a droplet generator within the LPP EUV source plasma chamber;
obtaining data about the first burst of the LPP EUV system, the data comprising a first control signal vector and a first error vector, wherein the first error vector is a difference between a first desired output vector and a first actual output vector due at least in part to a periodic disturbance or presence of periodic system orbits in the LPP EUV system;
generating, by a controller, a second control signal vector using an iterative learning controller (ILC), wherein the generating is based on the first control signal vector and the first error vector; and
communicating the second control signal vector from the controller to the laser source or the droplet generator for a second burst.

20. The non-transitory computer readable medium of claim 19, wherein the operations further comprise:
obtaining data about the second burst as the second control signal vector, the system state matrix, and a second error vector, wherein the second error vector is a difference between a second desired output vector and a second actual output vector due to the periodic disturbance in the LPP EUV system caused by the variation of the distance of a second of the generated droplets from the primary focus point when the laser source fires a second of the laser pulses at the primary focus point;
generating, by the controller, a third control signal vector using the ILC, wherein the generating is based on the second control signal vector and the second error vector; and
communicating the third control signal vector from the controller to the laser source or the droplet generator for a third burst subsequent to the second burst.

* * * * *